US010560061B2

(12) United States Patent
Herrera et al.

(10) Patent No.: US 10,560,061 B2
(45) Date of Patent: Feb. 11, 2020

(54) LOW CAPACITANCE SWITCH FOR PROGRAMMABLE GAIN AMPLIFIER OR PROGRAMABLE GAIN INSTRUMENTATION AMPLIFIER

(71) Applicant: Analog Devices, Inc., Norwood, MA (US)

(72) Inventors: Sandro Herrera, Medford, MA (US); Alan K Jeffery, North Andover, MA (US)

(73) Assignee: Analog Devices, Inc., Norwood, MA (US)

( * ) Notice: Subject to any disclaimer, the term of this patent is extended or adjusted under 35 U.S.C. 154(b) by 105 days.

(21) Appl. No.: 15/254,782

(22) Filed: Sep. 1, 2016

(65) Prior Publication Data

US 2018/0062646 A1    Mar. 1, 2018

(51) Int. Cl.
*H03K 17/687* (2006.01)
*H03F 1/34* (2006.01)
(Continued)

(52) U.S. Cl.
CPC ......... *H03F 1/342* (2013.01); *H03F 3/45475* (2013.01); *H03G 1/0088* (2013.01);
(Continued)

(58) Field of Classification Search
CPC ....... H03K 17/6872; H03F 1/342; H03G 3/30
(Continued)

(56) References Cited

U.S. PATENT DOCUMENTS

| 4,473,761 A | 9/1984 | Peterson et al. |
| 6,208,195 B1 | 3/2001 | Wyland et al. |

(Continued)

FOREIGN PATENT DOCUMENTS

| JP | 2008117885 A | 5/2008 |
| WO | WO-2013161478 A1 | 10/2013 |

(Continued)

OTHER PUBLICATIONS

"U.S. Appl. No. 15/254,696, Non Final Office Action dated Dec. 13, 2017", 12 pgs.
(Continued)

*Primary Examiner* — Metasebia T Retebo
(74) *Attorney, Agent, or Firm* — Schwegman Lundberg & Woessner, P.A.

(57) ABSTRACT

A low capacitance n-channel analog switch circuit, a p-channel analog switch circuit, and a full CMOS transmission gate (T-gate) circuit are described. Resistive decoupling can be used to isolate the switch or T-gate from AC grounds. A semiconductor region that is separated from a body region of a pass field-effect transistor (FET), such as by an insulator, can be coupled to or driven to a voltage similar to the input voltage or other desired bias voltage (e.g., an operational amplifier output) to help reduce parasitic capacitance of the switch or T-gate. The switch or T-gate can help provide improved frequency bandwidth or frequency response. The switch can be useful in a programmable gain amplifier (PGA) or programmable gain instrumentation amplifier (PGIA) or other circuit in which excessive switch capacitance could degrade circuit performance.

20 Claims, 9 Drawing Sheets

(51) Int. Cl.
  *H03K 17/06*  (2006.01)
  *H03G 1/00*   (2006.01)
  *H03F 3/45*   (2006.01)
  *H03G 3/00*   (2006.01)

(52) U.S. Cl.
  CPC .......... *H03G 3/001* (2013.01); *H03K 17/063* (2013.01); *H03F 2200/261* (2013.01); *H03F 2203/45528* (2013.01); *H03F 2203/45534* (2013.01); *H03F 2203/45544* (2013.01); *H03F 2203/45594* (2013.01); *H03K 2217/0018* (2013.01); *H03K 2217/0054* (2013.01)

(58) Field of Classification Search
  USPC ................... 327/437, 308; 438/109; 257/369
  See application file for complete search history.

(56) References Cited

U.S. PATENT DOCUMENTS

| | | | |
|---|---|---|---|
| 6,504,212 | B1 | 1/2003 | Allen et al. |
| 6,628,159 | B2 | 9/2003 | Voldman |
| 8,581,656 | B2 | 11/2013 | Curatolo |
| 9,716,500 | B2 | 7/2017 | Hu |
| 10,200,029 | B2 | 2/2019 | Herrera et al. |
| 2005/0098094 | A1 | 5/2005 | Oh et al. |
| 2006/0208787 | A1* | 9/2006 | Callahan, Jr. ........ H03K 17/162 327/404 |
| 2011/0221519 | A1* | 9/2011 | Katoh ................. H04B 1/0057 327/558 |
| 2012/0280738 | A1* | 11/2012 | Granger-Jones ..... H03H 11/245 327/308 |
| 2012/0292700 | A1* | 11/2012 | Khakifirooz ............ H01L 21/84 257/347 |
| 2013/0154740 | A1* | 6/2013 | Xie ....................... H03F 1/3211 330/260 |
| 2014/0070976 | A1 | 3/2014 | Hurrell et al. |
| 2014/0145246 | A1* | 5/2014 | Ning .................... H01L 29/812 257/280 |
| 2015/0084693 | A1* | 3/2015 | Larson ................ H03F 3/45475 330/254 |
| 2015/0372087 | A1 | 12/2015 | Fachmann et al. |
| 2015/0381171 | A1 | 12/2015 | Cebi et al. |
| 2016/0043722 | A1* | 2/2016 | Hu .................... H03K 19/00315 327/109 |
| 2018/0062644 | A1 | 3/2018 | Herrera et al. |

FOREIGN PATENT DOCUMENTS

| | | |
|---|---|---|
| WO | WO-2014011510 A2 | 1/2014 |
| WO | WO-2018045298 A1 | 3/2018 |

OTHER PUBLICATIONS

"U.S. Appl. No. 15/254,696, Non Final Office Action dated Jan. 2, 2018", 12 pgs.

"U.S. Appl. No. 15/254,696, Response filed Apr. 2, 2018 to Non Final Office Action dated Jan. 2, 2018", 11 pgs.

"International Application Serial No. PCT/US2017/049876, International Search Report dated Jan. 11, 2018", 6 pgs.

"International Application Serial No. PCT/US2017/049876, Written Opinion dated Jan. 11, 2018", 3 pgs.

"U.S. Appl. No. 15/254,696, Notice of Allowance dated Sep. 17, 2018", 7 pgs.

"U.S. Appl. No. 15/254,696, Corrected Notice of Allowability dated Oct. 9, 2018", 2 pgs.

"U.S. Appl. No. 15/254,696, Amendmebt Under 37 C.F.R filed Sep. 17, 2018", 7 pgs.

"U.S. Appl. No. 15/254,696, PTO Response to Rule 312 Communication dated Dec. 4, 2018", 2 pgs.

* cited by examiner

Pre-Amplifier Full Circuit

Differential Mode Half Circuit

LOW CAPACITANCE SWITCH FOR PROGRAMMABLE GAIN AMPLIFIER OR PROGRAMABLE GAIN INSTRUMENTATION AMPLIFIER

TECHNICAL FIELD

This document pertains generally, but not by way of limitation, to switching electrical signals and more particularly, but not by way of limitation, to a low capacitance analog switch or transmission gate, such as for a programmable gain amplifier circuit, a programmable gain instrumentation amplifier circuit or the like.

BACKGROUND

There are many circuits in which switches are located between nodes, one or more of which may be very capacitance sensitive. For example, Programmable Gain Amplifiers (PGAs) and Programmable Gain Instrumentation Amplifiers (PGIAs) are examples of such circuits in which switches may couple capacitive sensitive nodes. In these circuits, the gain setting switches can be located between the feedback network and the inverting input of an operational amplifier. The added capacitance due to such switches can limit the AC performance of such circuits.

SUMMARY

The present inventors have recognized, among other things, a need for a low capacitance switch or transmission gate, such as can be useful in a PGA, a PGIA, or other circuit in which switch capacitance can affect performance, e.g., such as by limiting the frequency bandwidth of such a circuit.

A low capacitance n-channel analog switch circuit, p-channel analog switch circuit, and full CMOS transmission gate (T-gate) circuits are described. Resistive decoupling can be used to decouple or isolate the switch or T-gate from one or more AC ground nodes, such as one or more switch control signal inputs or supply voltages. A semiconductor region that is separated from a body region of a pass field-effect transistor (FET), such as by an insulator, can be coupled to or driven to a voltage similar to the input voltage or other desired voltage such as to help reduce parasitic capacitance of the switch or T-gate. The switch or T-gate can help provide improved frequency bandwidth or frequency response. The switch or T-gate can be useful in a programmable gain amplifier (PGA) or programmable gain instrumentation amplifier (PGIA) or other circuit in which excessive switch capacitance could degrade circuit performance. The semiconductor region that is separated from a body region of a pass field-effect transistor (FET), such as by an insulator, can be connected to a desired signal voltage such as to an output of an operational amplifier circuit in the PGA or PGIA or other circuit, such as to provide pole-zero cancellation to improve the frequency response of the circuit.

A non-limiting list of numbered examples of certain aspects of the present subject matter is listed below.

Aspect 1 can include or use subject matter (such as an apparatus, a system, a device, a method, a means for performing acts, or a device readable medium including instructions that, when performed by the device, can cause the device to perform acts), such as can include or use an analog switch circuit. The analog switch circuit can include a first pass FET, such as including a gate coupled to a first control signal input, a first conduction terminal that can be coupled to a signal input, a second conduction terminal that can be coupled to a signal output, and a first body that can be switchably coupled to a first bias voltage such as via a first body decoupling resistor when the first pass FET is off, the first body can also be switchably coupled to at least one of the signal input or the signal output when the first pass FET is on.

Aspect 2 can include or use, or can optionally be combined with the subject matter of Aspect 1, to optionally include or use the first body being separated from a first semiconductor region such as by an insulator, wherein the first semiconductor region can be coupled to, or driven to a voltage like that of, one of the signal input or the signal output.

Aspect 3 can include or use, or can optionally be combined with the subject matter of one or any combination of Aspects 1 or 2 to include or use the first semiconductor region being coupled to, or driven to a voltage like that of, the signal input.

Aspect 4 can include or use, or can optionally be combined with the subject matter of one or any combination of Aspects 1 through 3 to include or use a first buffer circuit such as coupling the signal input to the first semiconductor region such as to drive a voltage of the first semiconductor region to a voltage like that of the signal input, such as wherein the first buffer circuit can include a first buffer input and a first buffer output and can be configured to provide a higher input impedance at the first buffer input than an output impedance at the first buffer output.

Aspect 5 can include or use, or can optionally be combined with the subject matter of one or any combination of Aspects 1 through 4 to include or use the first body being switchably coupled to the signal input when the first pass FET is on.

Aspect 6 can include or use, or can optionally be combined with the subject matter of one or any combination of Aspects 1 through 5 to include or use the first pass FET including the gate coupled to the first control signal input such as via a first gate decoupling resistor.

Aspect 7 can include or use, or can optionally be combined with the subject matter of one or any combination of Aspects 1 through 6 to include or use a second pass FET, such as including a gate that can be coupled to a second control signal input, a first conduction terminal that can be coupled to the signal input, a second conduction terminal that can be coupled to the signal output, and a second body that can be switchably coupled to a second bias voltage such as via a second body decoupling resistor when the second pass FET is off, the second body can also be switchably coupled to at least one of the signal input or the signal output when the second pass FET is on.

Aspect 8 can include or use, or can optionally be combined with the subject matter of one or any combination of Aspects 1 through 7 to include or use the first pass FET being an NFET and the second pass FET being a PFET, and wherein the first pass FET and the second pass FET can complement each other to form a transmission gate.

Aspect 9 can include or use, or can optionally be combined with the subject matter of one or any combination of Aspects 1 through 8 to include or use the second body being separated from a second semiconductor region by an insulator, wherein the second semiconductor region can be coupled to, or driven to a voltage like that of, one of the signal input or the signal output.

Aspect 10 can include or use, or can optionally be combined with the subject matter of one or any combination of Aspects 1 through 9 to include or use the first semiconductor region and the second semiconductor region being shared in common between the first pass FET and the second pass FET.

Aspect 11 can include or use, or can optionally be combined with the subject matter of one or any combination of Aspects 1 through 10 to include or use a second buffer circuit such as coupling the signal input to the second semiconductor region such as to drive a voltage of the second semiconductor region to a voltage like that of the signal input, wherein the second buffer circuit can include a second buffer input and a second buffer output and can be configured to provide a higher input impedance at the second buffer input than an output impedance at the second buffer output.

Aspect 12 can include or use, or can optionally be combined with the subject matter of one or any combination of Aspects 1 through 11 to include or use the second pass FET, such as can have the gate coupled to the second control signal input such as via a second gate decoupling resistor.

Aspect 13 can include or use, or can optionally be combined with the subject matter of one or any combination of Aspects 1 through 12 to include or use the first body being separated from a first semiconductor region such as by an insulator, such as wherein the first body can be switchably coupled to the signal input when the first pass FET is on such as by a first switching FET having a first switching FET body that can also be separated from the first semiconductor region by an insulator, and wherein the analog switch circuit can further comprise a first buffer circuit such as coupling the signal input to the first semiconductor region.

Aspect 14 can include or use, or can optionally be combined with the subject matter of one or any combination of Aspects 1 through 13 to include or use an analog switch circuit. The analog switch circuit can include a first pass FET, such as including a gate coupled to a first control signal input, a first conduction terminal coupled to a signal input such as via a first gate decoupling resistor, a second conduction terminal coupled to a signal output, and a first body switchably coupled to a first bias voltage such as via a first body decoupling resistor when the first pass FET is off, the first body also switchably coupled to the signal input when the first pass FET is on. The analog switch can include a second pass FET, including a gate coupled to a second control signal input via a second gate decoupling resistor, a first conduction terminal coupled to the signal input, a second conduction terminal coupled to the signal output, and a second body switchably coupled to a second bias voltage via a second body decoupling resistor when the second pass FET is off, the second body also switchably coupled to the signal input when the second pass FET is on.

Aspect 15 can include or use, or can optionally be combined with the subject matter of one or any combination of Aspects 1 through 3 to include or use a method of using at least a first pass FET for switchably passing or isolating an analog signal from a signal input to a signal output. This can include: decoupling, via a first body decoupling resistor, a body of the first pass FET from a first bias voltage when the first pass FET is off; and switchably coupling the body of the first pass FET to one of the signal input or the signal output when the first pass FET is on.

Aspect 16 can include or use, or can optionally be combined with the subject matter of one or any combination of Aspects 1 through 15 to include or use decoupling, such as via a first gate decoupling resistor, a first control signal input from a gate of the first pass FET.

Aspect 17 can include or use, or can optionally be combined with the subject matter of one or any combination of Aspects 1 through 16 to include or use the first body being separated from a first semiconductor region by an insulator, and comprising: driving the first semiconductor region to a voltage like that of one of the signal input or the signal output.

Aspect 18 can include or use, or can optionally be combined with the subject matter of one or any combination of Aspects 1 through 17 to include or use driving the first semiconductor region to a voltage like that of one of the signal input or the signal output comprises driving the first semiconductor region to a voltage like that of the signal input.

Aspect 19 can include or use, or can optionally be combined with the subject matter of one or any combination of Aspects 1 through 18 to include or use switchably coupling the body of the first pass FET to one of the signal input or the signal output when the first pass FET is on comprises switchably coupling the body of the first pass FET to the signal input when the first pass FET is on.

Aspect 20 can include or use, or can optionally be combined with the subject matter of one or any combination of Aspects 1 through 19 to include or use a second pass FET, complementary in type to the first pass FET, for switchably passing or isolating an analog signal from a signal input to a signal output. This can include a method comprising: decoupling, via a second body decoupling resistor, a body of the second pass FET from a second bias voltage when the second pass FET is off; and switchably coupling the body of the second pass FET to one of the signal input or the signal output when the second pass FET is on.

Aspect 21 can include or use, or can optionally be combined with the subject matter of one or any combination of Aspects 1 through 20, to include or use subject matter (such as an apparatus, a system, a device, a method, a means for performing acts, or a device readable medium including instructions that, when performed by the device, can cause the device to perform acts), such as can include or use an analog switch circuit. The analog switch circuit can include or use a first pass FET. The first pass FET can include a gate coupled to a first control signal input, a first conduction terminal coupled to a signal input, a second conduction terminal coupled to a signal output, and a first body. The first body can be separated from a local first semiconductor region by a first insulator.

Aspect 22 can include or use, or can optionally be combined with the subject matter of one or any combination of Aspects 1 through 21, to include or use subject matter, wherein the local first semiconductor region can be dedicated to the analog switch circuit by being additionally electrically isolated by a second insulator that, together with the first insulator and an underlying third insulator, can form a moat region about or near the first pass FET. The local first semiconductor region can be coupled to a circuit node, or driven to, a bias voltage.

Aspect 23 can include or use, or can optionally be combined with the subject matter of one or any combination of Aspects 1 through 22, to include or use subject matter wherein the local first semiconductor region can be coupled to, or driven to a voltage like that of, one of the signal input or the signal output.

Aspect 24 can include or use, or can optionally be combined with the subject matter of one or any combination of Aspects 1 through 23, to include or use subject matter, wherein the local first semiconductor region can be coupled to, or driven to a voltage like that of, the signal output.

Aspect 25 can include or use, or can optionally be combined with the subject matter of one or any combination of Aspects 1 through 24, to include or use subject matter, wherein the local first semiconductor region can be electrically connected to (or driven to a voltage like that of) a signal output of an amplifier of the programmable gain amplifier circuit.

Aspect 26 can include or use, or can optionally be combined with the subject matter of one or any combination of Aspects 1 through 25, to include or use subject matter, wherein the local first semiconductor region can be electrically connected to (or driven to a voltage like that of) a signal output of an amplifier of the programmable gain instrumentation amplifier circuit.

Aspect 27 can include or use, or can optionally be combined with the subject matter of one or any combination of Aspects 1 through 26, to include or use subject matter, wherein the first body can be switchably coupled to a first bias voltage such as via a first body decoupling resistor when the first pass FET is off, the first body also can be switchably coupled to at least one of the signal input or the signal output when the first pass FET is on.

Aspect 28 can include or use, or can optionally be combined with the subject matter of one or any combination of Aspects 1 through 27, to include or use subject matter, wherein the first body can be switchably coupled to the signal input when the first pass FET is on.

Aspect 29 can include or use, or can optionally be combined with the subject matter of one or any combination of Aspects 1 through 28, to include or use subject matter, wherein the first pass FET can include the gate coupled to the first control signal input such as via a first gate decoupling resistor.

Aspect 30 can include or use, or can optionally be combined with the subject matter of one or any combination of Aspects 1 through 29, to include or use subject matter such as can further comprise a second pass FET. The second pass FET can include a gate that can be coupled to a second control signal input, a first conduction terminal that can be coupled to the signal input, a second conduction terminal that can be coupled to the signal output, and a second body, wherein the second body can be separated from a second local semiconductor region by an insulator, wherein the second local semiconductor region is coupled to a circuit node, or driven to a bias voltage. The first pass FET can be an NFET and the second pass FET can be a PFET. The first pass FET and the second pass FET can complement each other to form a transmission gate.

Aspect 31 can include or use, or can optionally be combined with the subject matter of one or any combination of Aspects 1 through 30, to include or use subject matter, wherein the first semiconductor region and the second semiconductor region can be shared in common between the first pass FET and the second pass FET.

Aspect 32 can include or use, or can optionally be combined with the subject matter of one or any combination of Aspects 1 through 31, to include or use subject matter, wherein the second pass FET can include the gate coupled to the second control signal input via a second gate decoupling resistor.

Aspect 33 can include or use, or can optionally be combined with the subject matter of one or any combination of Aspects 1 through 32, to include or use subject matter (such as an apparatus, a system, a device, a method, a means for performing acts, or a device readable medium including instructions that, when performed by the device, can cause the device to perform acts), such as can include or use an analog switch circuit. The analog switch circuit can include a first pass FET, such as including a gate coupled to a first control signal input, a first conduction terminal coupled to a signal input via a first gate decoupling resistor, a second conduction terminal coupled to a signal output, and a first body separated from a local first semiconductor region by a first insulator. A second pass FET can also be included. The second pass FET can include a gate coupled to a second control signal input via a second gate decoupling resistor, a first conduction terminal coupled to the signal input, a second conduction terminal coupled to the signal output, and a second body separated from a local second semiconductor region by a second insulator. The local first and second semiconductor regions can be electrically connected to an amplifier signal output.

Aspect 34 can include or use, or can optionally be combined with the subject matter of one or any combination of Aspects 1 through 33, to include or use subject matter, in which the analog switch circuit can be included in a feedback network of a programmable gain amplifier circuit. The local first and second semiconductor regions can be connected to a signal output of an amplifier in the programmable gain amplifier circuit.

Aspect 35 can include or use, or can optionally be combined with the subject matter of one or any combination of Aspects 1 through 34, to include or use subject matter, in which the analog switch circuit can be included in a feedback network of a programmable gain instrumentation amplifier circuit. The local first and second semiconductor regions can be connected to a signal output of an amplifier in the programmable gain instrumentation amplifier circuit.

Aspect 36 can include or use, or can optionally be combined with the subject matter of one or any combination of Aspects 1 through 35, to include or use subject matter, wherein the local first and second semiconductor regions can be shared.

Aspect 37 can include or use, or can optionally be combined with the subject matter of one or any combination of Aspects 1 through 36, to include or use subject matter, that can provide a method of using at least a first pass FET for switchably passing or isolating an analog signal from a signal input to a signal output. The method can comprise: providing a first control signal to a gate of a first pass FET to turn the first pass FET on to pass the analog signal from the signal input to the signal output and to turn the first pass FET off to isolate the analog signal at the signal input from the signal output; and coupling or driving, to a circuit node or a bias voltage, a local first semiconductor region, separated from a body region of the first pass FET by a first insulator, and separated from other circuitry on an integrated circuit by a second insulator.

Aspect 38 can include or use, or can optionally be combined with the subject matter of one or any combination of Aspects 1 through 37, to include or use subject matter, such as can comprise connecting the local first semiconductor region to the signal output of an amplifier circuit when the first pass FET is on and when the first pass FET is off.

Aspect 39 can include or use, or can optionally be combined with the subject matter of one or any combination of Aspects 1 through 37, to include or use subject matter, such as can comprise using the first pass FET to selectively switch at least one element in a feedback network of at least one of programmable gain amplifier circuit or a programmable gain instrumentation amplifier circuit.

Aspect 40 can include or use, or can optionally be combined with the subject matter of one or any combination of Aspects 1 through 37, to include or use subject matter, such as can comprise: using a second pass FET, complementary in type to the first pass FET, for switchably passing or isolating an analog signal from a signal input to a signal output. The method can comprise: providing a second control signal to a gate of the second pass FET to turn the second pass FET on to pass the analog signal from the signal input to the signal output and to turn the second pass FET off to isolate the analog signal at the signal input from the signal output; and coupling the local first semiconductor region, separated from a body region of the second pass FET by a second insulator, to the signal output of an operational amplifier circuit of a programmable gain amplifier (PGA) or a programmable gain instrumentation amplifier (PGIA) when the second pass FET is on and when the second pass FET is off.

Each of these non-limiting examples can stand on its own, or can be combined in various permutations or combinations with one or more of the other examples.

This overview is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components.

The drawings illustrate generally, by way of example, but not by way of limitation, various embodiments discussed in the present document.

DETAILED DESCRIPTION

A low capacitance n-channel analog switch circuit, p-channel analog switch circuit, and full CMOS transmission gate (T-gate) circuits are described. Resistive decoupling can be used to help decouple or isolate the switch or T-gate from AC grounds, such as one or more switch control signal inputs or supply voltages. A semiconductor region that is separated from a body region of a pass field-effect transistor (FET) can be can be coupled to or driven to a voltage similar to the input voltage or other desired voltage to help reduce parasitic capacitance of the switch or T-gate. The switch or T-gate can help provide improved frequency bandwidth or frequency response. The switch can be useful in a programmable gain amplifier (PGA) or programmable gain instrumentation amplifier (PGIA) or other circuit in which excessive switch capacitance could degrade circuit performance. The semiconductor region that is separated from a body region of a pass field-effect transistor (FET), such as by an insulator, can be connected to a desired signal voltage such as to an output of an operational amplifier circuit in the PGA or PGIA or other circuit, such as to provide pole-zero cancellation to improve the frequency response of the circuit.

Figure 1:
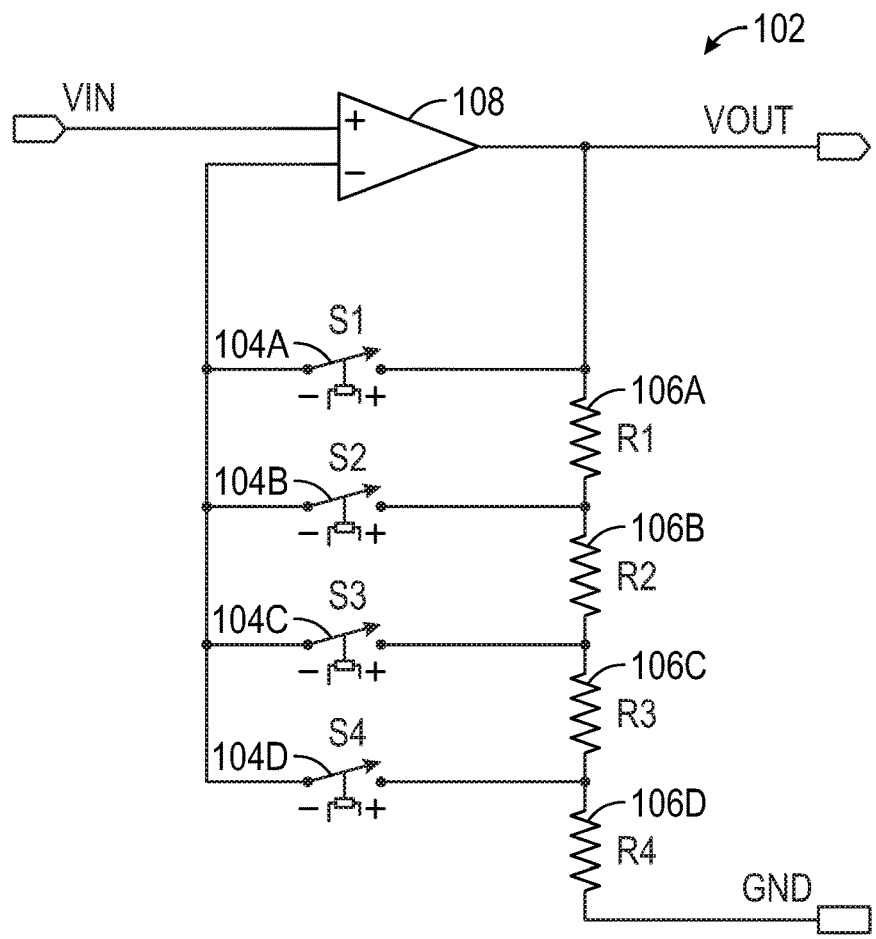
FIG. 1 shows an example of a programmable gain amplifier (PGA) circuit.

FIG. 1 shows an example of a programmable gain amplifier (PGA) circuit 102, which can include one or more low capacitance switches 104. The switches 104 can be used for switchably coupling nodes between resistances 106 in the feedback network around the operational amplifier 108 to its inverting input, such as when an input signal, Vin, is applied to its non-inverting input. For a given gain setting, only one of the switches 104 will generally be turned on, and the others will be turned off, but will nonetheless contribute capacitance at the capacitance-sensitive node of the inverting input of the operational amplifier 108.

Figure 2A:
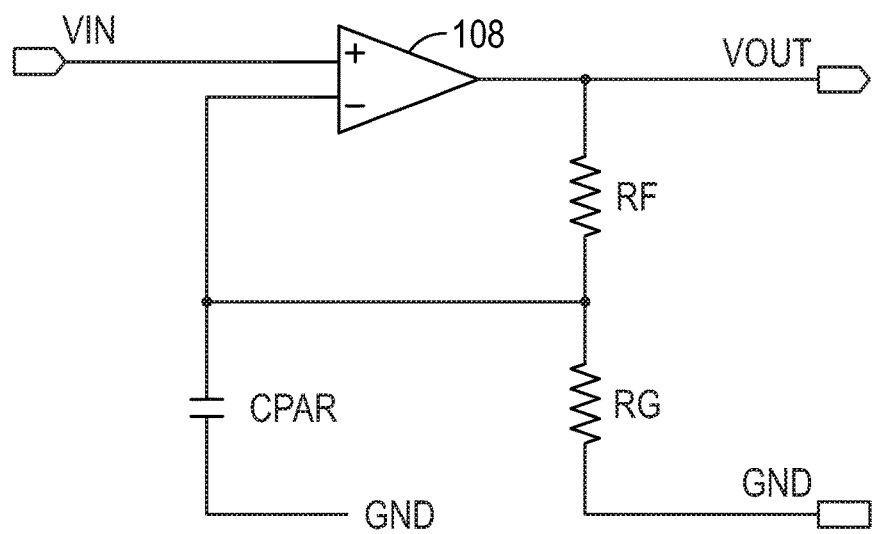
FIG. 2A shows a simplified model of the circuit of FIG. 1.

FIG. 2A shows a simplified model of the circuit of FIG. 1, in which the "on" resistances of the switches (which are small) can be ignored, and all the switches 104, whether "on" or "off" can be treated as capacitors, such that the network of such switches 104 can be modeled as a lumped capacitor $C_{PAR}$ to ground (GND). The capacitor $C_{PAR}$ introduces a pole to the amplifier's loop gain, such that the s-domain loop transfer function of the PGA circuit 102 of FIGS. 1-2 can be expressed according to Equation 1.

$$L(s) = A(s) \cdot \frac{R_G}{R_F + R_G} \cdot \frac{1}{sR_F \| R_G C_{PAR} + 1} \qquad \text{Eq. 1}$$

where A(s) is the open loop gain of the operational amplifier 108. The location of the new pole can be expressed according to Equation 2.

$$p_{PAR} = 1/(R_F \| R_G \cdot C_{PAR}) \qquad \text{Eq. 2}$$

If the amplifier 108 were to be decompensated to regain frequency bandwidth, this pole would set a limitation on the achievable frequency bandwidth. Therefore, performance of the circuit shown in FIGS. 1-2 can be enhanced using a low parasitic capacitance analog switch or transmission gate, such as explained and described herein.

Figure 2B:
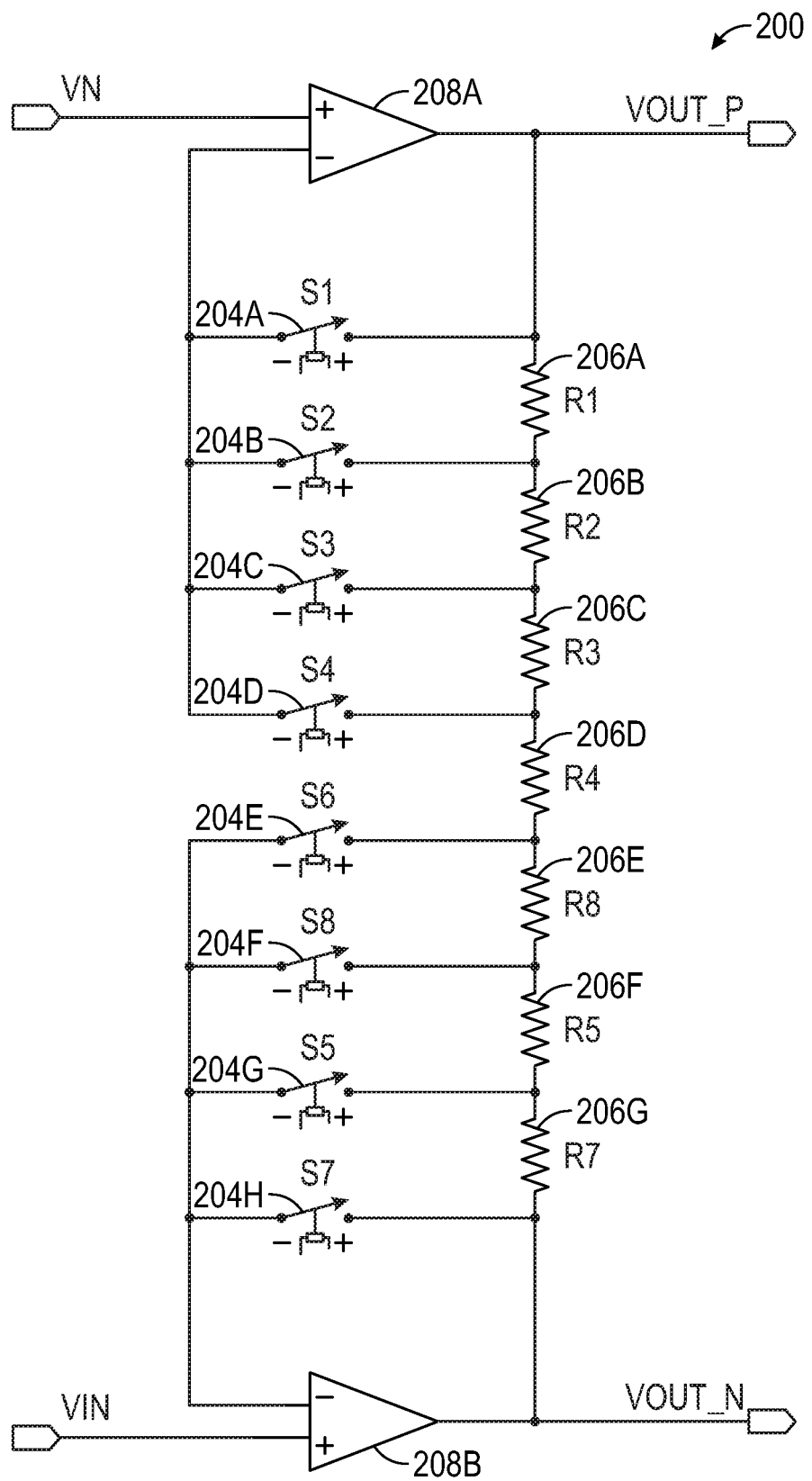
FIG. 2B shows an example of the pre-amplifier of a programmable gain instrumentation amplifier (PGIA) circuit.

FIG. 2B shows an example of a pre-amplifier 200 of a programmable gain instrumentation amplifier (PGIA) circuit. The pre-amplifier 200 can include one or more low capacitance switches 204, such as for switchably coupling nodes between resistances 206 in the feedback network around the operational amplifiers 208 to their respective inverting inputs. For a given gain setting, only one of the switches 204A-D and one of the switches 204E-H will generally be turned on, and the others will be turned off, but will nonetheless contribute capacitance at the capacitance-sensitive node of the inverting input of the operational amplifiers 208.

Figure 3:
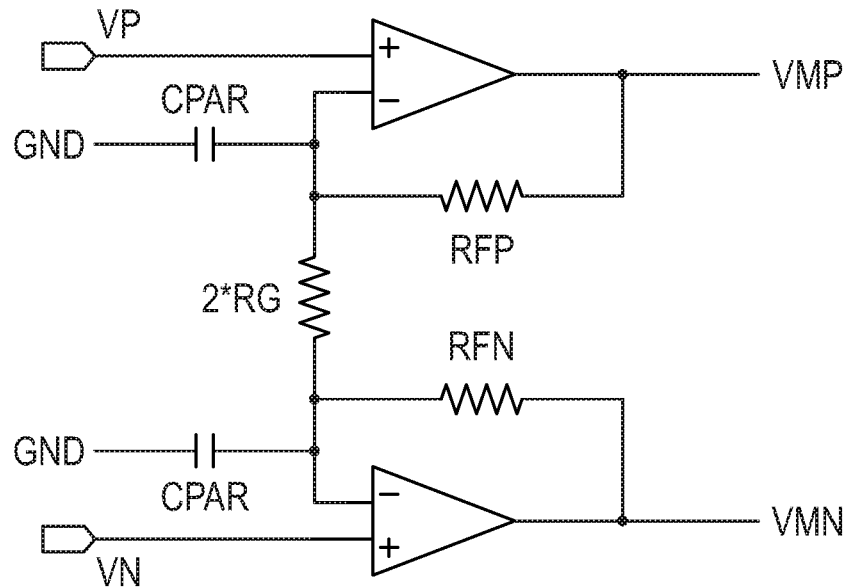
FIG. 3 shows a simplified model of the circuit of FIG. 2B.
Figure 4:
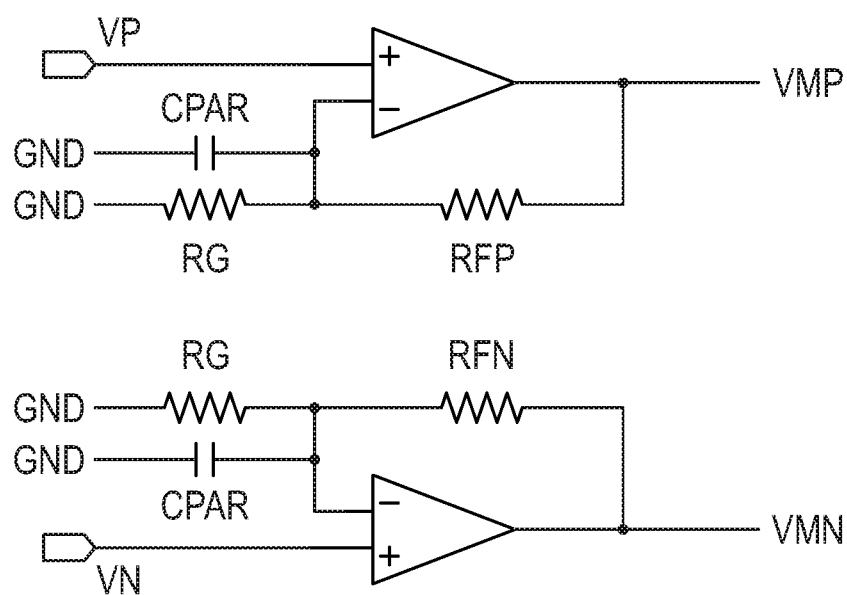
FIG. 4 shows a differential mode half-circuit model of the PGIA circuit of FIG. 3.
Figure 5:
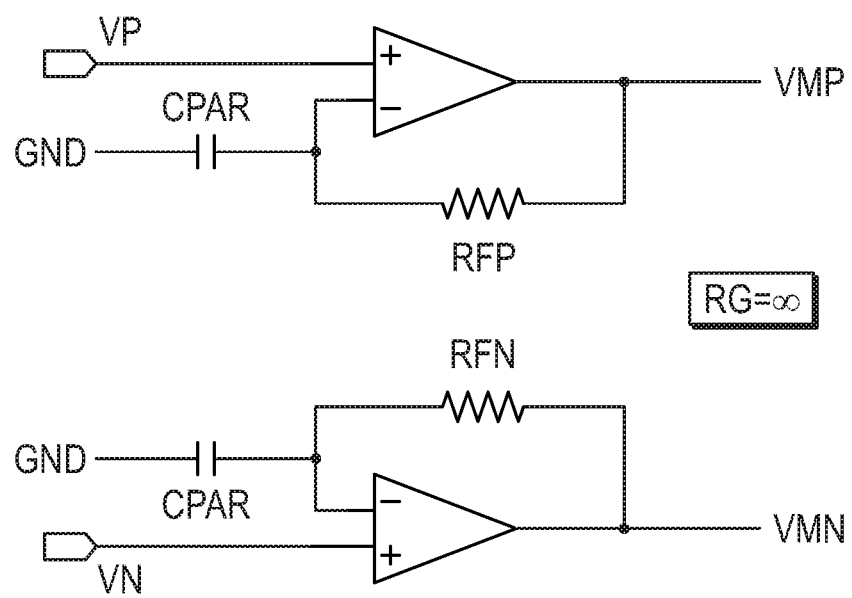
FIG. 5 shows a common mode half circuit model of the PGIA circuit of FIG. 3.

FIG. 3 shows a simplified model of the circuit of FIG. 2B, in which the "on" resistances of the switches (which are small) can be ignored, and all the switches 204, whether "on" or "off" can be treated as capacitors, such that the network of such switches 204 can be modeled as a lumped capacitor $C_{PAR}$ to ground (GND). The circuit in FIG. 3 can be modeled according to a differential mode half-circuit, such as shown in FIG. 4 and a common mode half-circuit, such as shown in FIG. 5. The differential mode half-circuit loop gain of FIG. 4 can be shown according to Equation. 3.

$$L(s) = A(s) \cdot \frac{R_G}{R_F + R_G} \cdot \frac{1}{sR_F \| R_G C_{PAR} + 1} \quad \text{Eq. 3}$$

The parasitic capacitance creates a pole, such as can be shown according to Equation 4.

$$p_{PAR\_DM} = 1/(R_F \| R_G \cdot C_{PAR}) \quad \text{Eq. 4}$$

The common mode half circuit loop gain of FIG. 5 can be shown according to Equation 5.

$$L(s) = A(s) \cdot \frac{1}{sR_F C_{PAR} + 1} \quad \text{Eq. 5}$$

For the common mode half circuit of FIG. 5, the loop is always at unity gain. The parasitic capacitance creates a pole, such as can be shown according to Equation 6.

$$p_{PAR\_CM} = 1/(R_F \cdot C_{PAR}) \quad \text{Eq. 6}$$

The common mode half circuit pole given in Equation 6 is at a lower frequency than the differential mode half circuit pole expressed in Equation 4 and, therefore, will dominate the frequency response bandwidth considerations.

In the PGIA pre-amplifier, the switch capacitance impact is more drastic than that of the PGA example. In the PGIA, the switch parasitic capacitance adds a pole to the common mode loop gain that does not get attenuated by the closed loop gain factor. Therefore, the amplifier cannot be decompensated to achieve a constant gain·bandwidth (GBW) product, and the introduced pole limits the frequency bandwidth of the common mode loop, which in turn limits the frequency bandwidth of the differential loop. Therefore, performance can be enhanced by a low $C_{PAR}$ switch, and pushing out in frequency the introduced pole.

Figure 6:
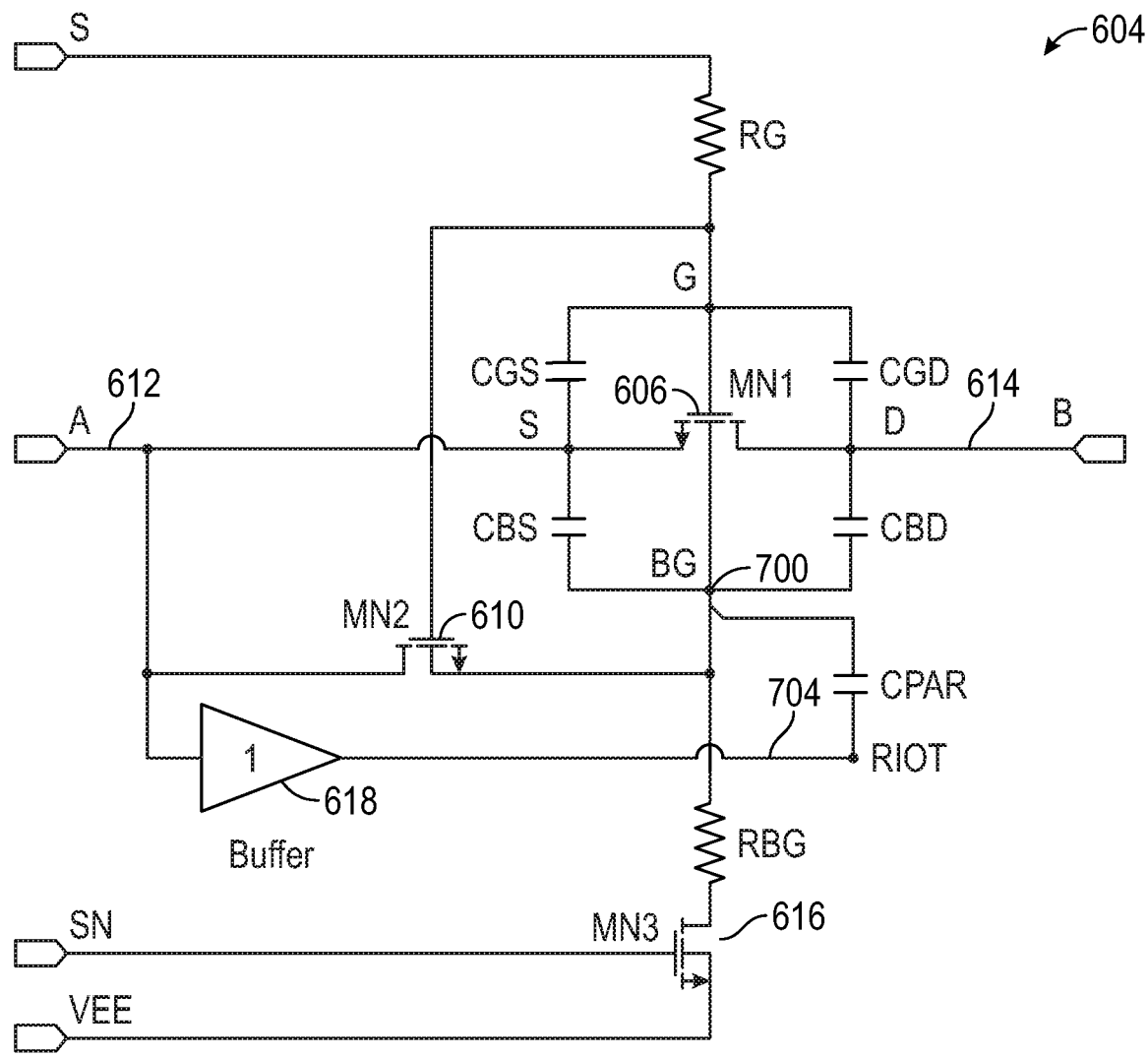
FIG. 6 shows an example of an analog switch circuit, which can be used to provide one or more of the low capacitance switches in the circuits of FIGS. 1-2.
Figure 7:
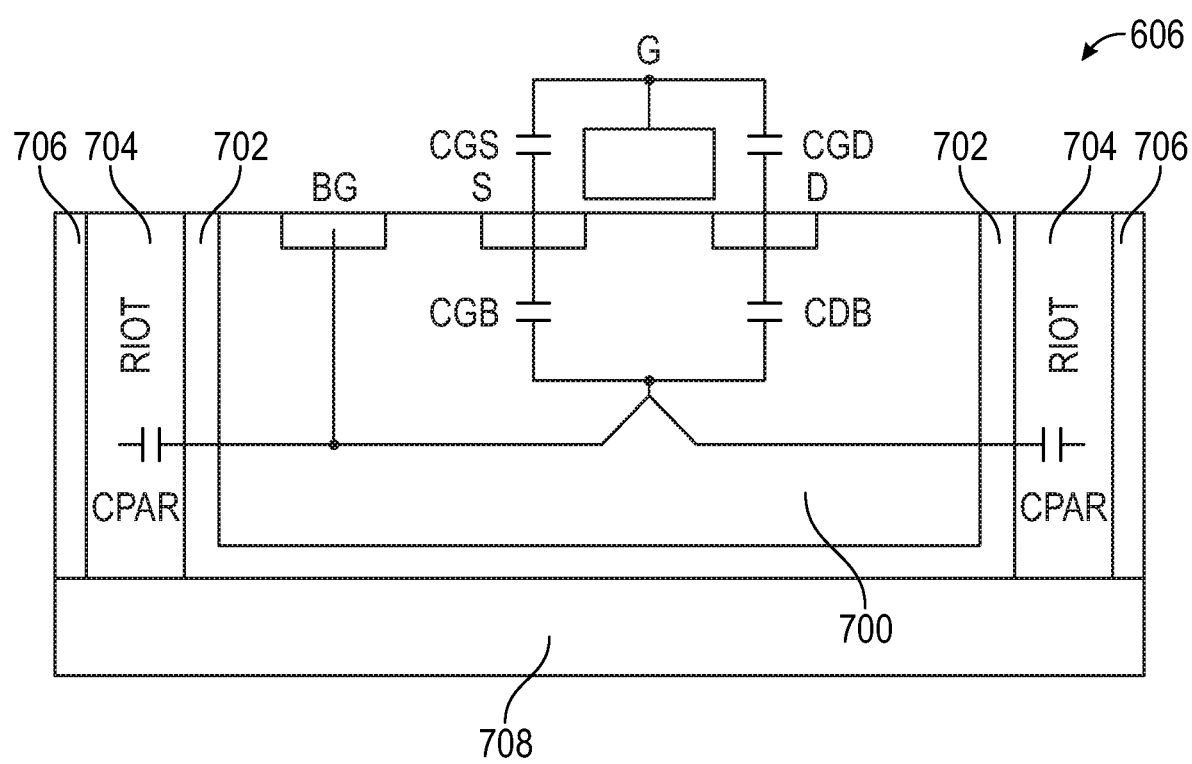
FIG. 7 shows a cross-sectional view example illustrating a physical field-effect transistor (FET) structure for one or more pass FETs, together with the various parasitic capacitances that can come into play for such a structure.

FIG. 6 shows an example of an analog switch circuit 604, which can be used to provide one or more of the low capacitance switches 104 of FIGS. 1-2. The analog switch circuit 604 can include one or more pass FETs 606. FIG. 7 shows a cross-sectional view example illustrating a physical field-effect transistor (FET) structure for the one or more pass FETs 606, together with the various parasitic capacitances that can come into play for such a structure, which can employ a semiconductor-on-insulator (SOI) process technology. In the example of FIGS. 6-7, the one or more pass FETs 606 can include a gate terminal (G), a first drain/source terminal (D), a second drain/source terminal (S), a back gate terminal (BG) to a body region 700 of the FET. The BG or body region 700 can be separated by an insulator 702 from a semiconductor region 704. The semiconductor region 704 can sometimes be referred to as a RIOT region. The semiconductor region 704 can be local to the FET device 606, for example, it can provide a moat-like local semiconductor region about the FET device 606 that can be separated from other circuitry on the same integrated circuit by another later insulator 706 and an underlying insulator 708. The semiconductor region 704 can be local to and shared by a complementary pair of n-type and p-type FET devices 606 of a full transmission gate, for example, it can provide a moat-like local semiconductor region about the complementary pair of FET devices 606 of the full transmission gate that can be separated from other circuitry on the same integrated circuit by another lateral insulator 706 and an underlying insulator 708. Because drain and source regions may be regarded as being defined by applied voltages, and interchangeable, they can be referred to interchangeably herein as drain/source regions, drain regions, source regions, or FET conduction terminals, which are distinguishable from the gate region (or FET control terminal) and distinguishable from the body region (or FET body terminal or "back-gate" terminal).

With a structure such as shown in FIG. 7, various capacitances can come into play, such as a gate-drain capacitance (CGD), a gate-source capacitance (CGS), a source-body capacitance (CSB), a drain-body capacitance (CDB), and a body to semiconductor capacitance ($C_{PAR}$) across the insulator 702. The circuit shown in FIG. 6 can be used to establish, for a given "on" or "off" state of the pass FET 606, appropriate voltages of the back-gate terminal or body region 700 and the semiconductor region 704, such as to reduce or minimize the parasitic capacitances imposed by the switch circuit 604 on other circuits in which it is used. This can include resistively decoupling (e.g., coupling via a resistor) one or more of (1) the BG or body region 700; and/or (2) the gate region (G) from one or more respective AC signal ground nodes, such as explained herein.

In the example of FIG. 6, the pass FET 606 can include a source that can be connected to a signal input A at node 612. The pass FET 606 can include a drain that can be connected to a signal output B at node 614. The BG or body region 700 of the pass FET 606 can be switchably connected to one of the signal input A at node 612 or the signal output B at node 614 when the pass FET 606 is on. For example, such as shown in FIG. 6, a FET or other switch 610 can be included such as to switchably connect the BG or body region 700 of the pass FET 606 to the signal input A at node 612 when the pass FET 606 is on. For example, where the pass FET 606 is an n-channel FET, the switch 610 can also be a n-channel FET, with the gate of the n-channel FET switch 610 connected to the gate of the n-channel pass FET 606, both of which can be connected to a control signal S, such as by an optional gate decoupling resistor RG. In this way, the pass FET 606 and the body switch FET 610 can both be on at the same time and can both be off at the same time, both under the control of the switch signal S. The back gate BG or body region 700 can be switchably coupled to a bias voltage (VEE) when the first pass FET 606 is off, such as via a FET or other switch 616 and, optionally also via a body decoupling resistor RBG that can be in series with the switch 616. The switch 616 can be turned off when the pass FET 606 is on, such as by connecting a gate of the switch 616 to a control signal SN that is inverted from or otherwise complementary to control signal S. The semiconductor region 704 can be coupled to, or driven to a voltage like that of, one of the signal input or the signal output. In the example of FIG. 6, a buffer circuit 618 can include a buffer circuit input that can be coupled to the signal input A at node 612, and a buffer circuit output that can be coupled to and can drive the semiconductor region 704. The buffer circuit 618 can include a source-follower or other unity gain buffer circuit that can present a high input impedance at the buffer circuit 618 input and a low output impedance at the buffer circuit 618 output.

In an operational example, when the n-channel pass FET 606 is on, the n-channel FET switch 610 is also on, and the n-channel FET switch 616 is off. In this state, the gate decoupling resistor RG resistively decouples the gate terminal of the pass FET 606 from the control signal S, which provides an AC ground. In this state, the gate decoupling resistor RG can isolate the parasitic capacitances CGS and CGD of the pass FET 606. In this state, the parasitic capacitance CBD of the pass FET 606 is shorted by the FET switch 610, and the body to semiconductor parasitic capacitance ($C_{PAR}$) across the insulator 702 is bootstrapped by being driven by the buffer circuit 618 to the voltage of the signal input at node 612. In this state, the parasitic capacitances associated with the FET switch 610 are isolated in a similar way as those associated with the pass FET 606.

In this operational example, when the n-channel pass FET 606 is off, the n-channel FET switch 610 is also off, and the n-channel FET switch 616 is on. In this state, the gate decoupling resistor RG resistively decouples the gate terminal of the pass FET 606 from the control signal S, which provides an AC ground. In this state, the gate decoupling resistor RG can isolate the parasitic capacitances CGS and CGD of the pass FET 606. In this state, the body decoupling resistor RBG can isolate the parasitic capacitances CBS and CBD of the pass FET 606. In this state, the body to semiconductor parasitic capacitance ($C_{PAR}$) across the insulator 702 is bootstrapped by being driven by the buffer circuit 618 to the voltage of the signal input at node 612 and, together with the body decoupling resistor RBG, ensures that the BG or body region 700 of the pass FET 606 is not directly tied to the AC ground voltage potential provided by the bias voltage VEE, but is instead resistively isolated from such AC ground node by the body decoupling resistor RBG. In this state, the parasitic capacitances associated with the FET switch 610 are isolated in a similar way as those associated with the pass FET 606.

The technique described for switching the BG or body region 700 and driving the semiconductor region 704, such as while resistively decoupling one or more of the gate of the pass FET 606 and the back-gate or body region 700 of the pass FET 606 can help effectively reduce the parasitic capacitance, particularly in the off state of the pass FET 606. This can be helpful in certain circuits, such as the PGA circuit 102 of FIG. 1, in which multiple switches 104 are off, but still loading the capacitance-sensitive node of the inverting input terminal of the operational amplifier 108.

Although the analog switch circuit 604 of FIG. 6 has been particularly described with respect to an n-channel pass FET 606, it can analogously be implemented using a p-channel pass FET, or can analogously be implemented by combining n-channel and p-channel pass FETs into a full transmission gate ("T-gate") configuration.

Figure 8:
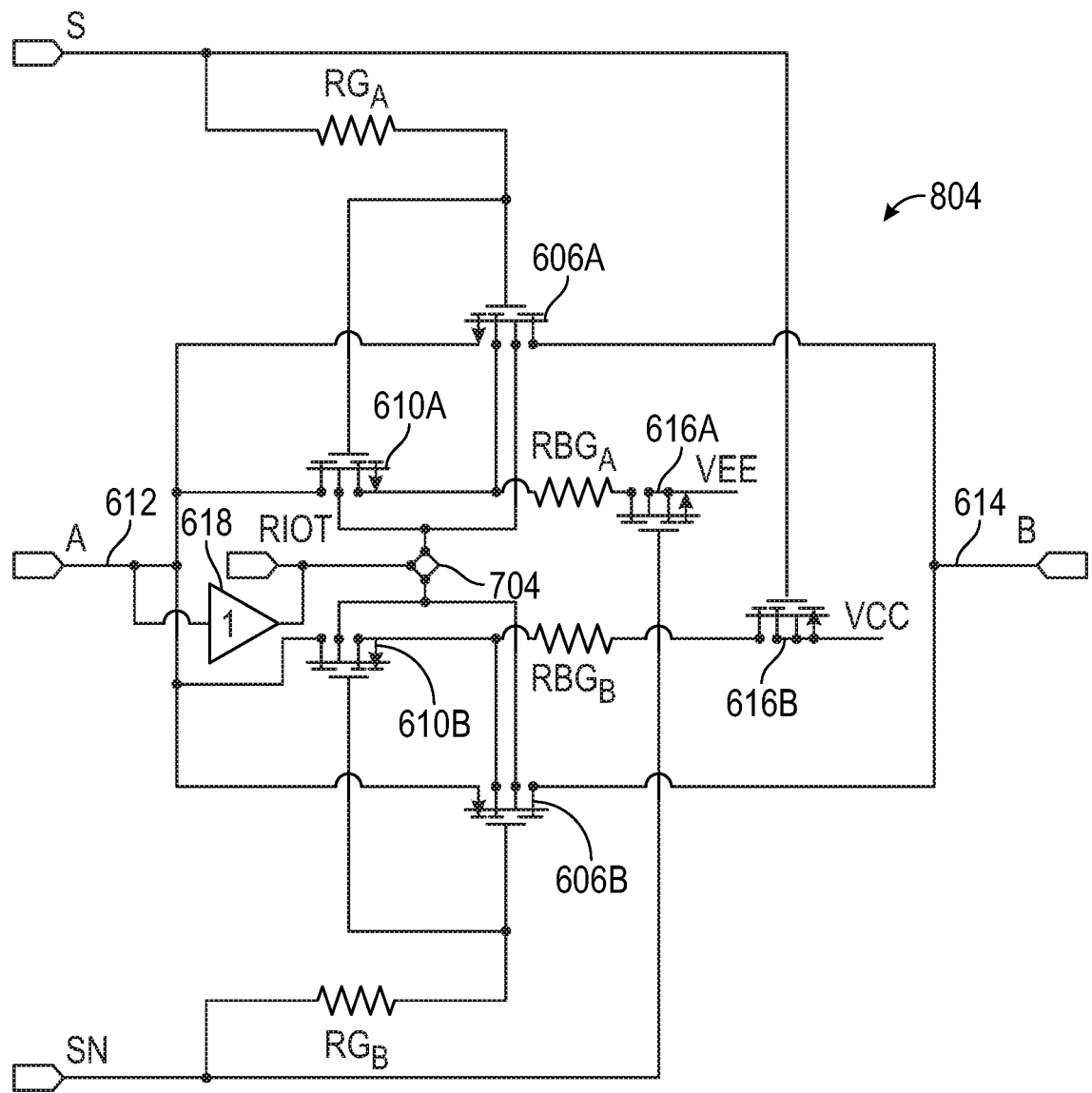
FIG. 8 shows an example of a full CMOS transmission gate circuit version of the analog switch circuit of FIG. 6.

FIG. 8 shows an example of a full CMOS transmission gate circuit 804 version of the analog switch circuit 604 of FIG. 6. The transmission gate circuit 804 can include a n-channel pass FET 606A, a p-channel pass FET 606B, an n-channel FET switch 610A, a p-channel FET switch 610B, an n-channel FET switch 616A such as to a negative supply (VEE), a p-channel FET switch 616B such as to a positive supply (VCC), a first gate decoupling resistor RGA, a second gate decoupling resistor RGB, a first back gate decoupling resistor RBGA, a second back gate decoupling resistor RBGB, with the components labeled with the suffix "A" following from the description of the corresponding components of FIG. 6, and the components labeled with the suffix "B" constituting the complementary analogously functioning components added to expand the analog switch circuit 604 of FIG. 6 to a full transmission gate configuration. In the example of FIG. 8, a semiconductor region 704 of the n-channel pass FET 606A can be connected to or shared in common with a semiconductor region of the p-channel pass FET 606B. A buffer circuit 618 can include an input that can be coupled to the signal input node 612 and an output that can be coupled to the semiconductor region 704, such as to drive the voltage of the semiconductor region 704 to the voltage at the signal input node 612.

Figure 9:
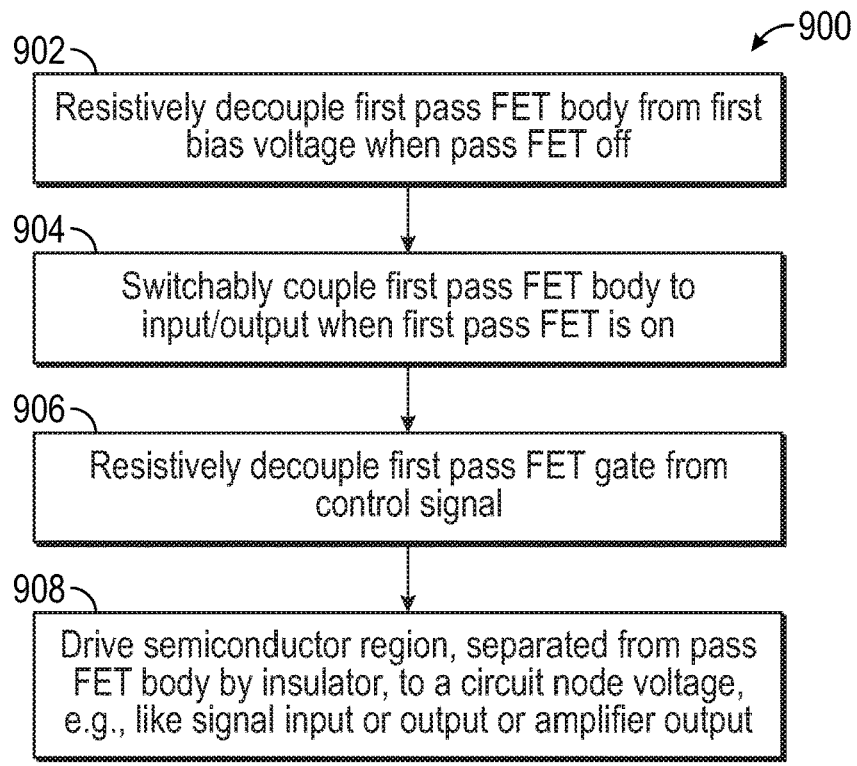
FIG. 9 is a diagram showing certain steps of a method of operating an analog switch, such as can include an n-channel pass FET.

FIG. 9 is a diagram showing certain steps of a method 900 of operating an analog switch, such as can include an n-channel pass FET 606. At 902, a body 700 of first pass FET 606 can be resistively decoupled from a first bias voltage (VEE) when the first pass FET 606 is off. At 904, the first pass FET 606 body 700 can be switchably coupled to an input 612 or an output 614 when the first pass FET 606 is on. At 906, a gate of the first pass FET 606 can be resistively decoupled from a control signal S when the first pass FET 606 is on or off. At 908, a semiconductor region 701 separated from a body 700 of the first pass FET 606 by an insulator 702 can be driven to a voltage like that at a signal input 612 or a signal output 614. The method 900 can be analogously applied to analog switch such as can include a p-channel pass FET, or to a full CMOS transmission gate.

Computer simulation of the CMOS transmission gate circuit 804 was carried out and demonstrated both frequency bandwidth expansion and improved frequency response as compared to a CMOS transmission gate without driving the semiconductor region 704 to the input voltage and without including gate and body decoupling resistors to provide resistive decoupling or isolation to S, SN, VEE, and VCC.

Example of Leveraging Parasitic Capacitance Using Amplifier Output

The above description has explained various examples of how to mitigate excess capacitance introduced by multiple switches onto a capacitance-sensitive node, such as an inverting input of an operational amplifier in a PGA, or PGIA circuit, by appropriately coupling the body and RIOT regions, or resistively decoupling the gate and body regions of one or more such switches (e.g., nFETs, pFETs, or full transmission gates) or driving the first semiconductor region with a voltage buffer to a voltage similar to the input or output voltage of the switch. As explained above, such techniques can improve frequency response, such as by pushing out in frequency the pole in the common mode (CM) loop gain of a programmable gain instrumentation amplifier (see Eq. 6) such that a higher frequency bandwidth can be achieved.

One potential issue with lowering the switch capacitance is that some residual switch capacitance will remain, which, together with the input capacitance of the operational amplifier 108, can limit the frequency bandwidth of the PGA, PGIA, or other circuit in which the switch and amplifier are being used. However, it is possible to use all or a portion of the switch parasitic capacitance to create a zero, rather than a pole, which can be employed to extend the frequency bandwidth of the PGA, PGIA, or other circuit in which the switch and amplifier are being used. This can be accomplished by driving the parasitic capacitance of the switch (or a portion of it) with an output of the amplifier 108, such as explained herein.

Figure 10:
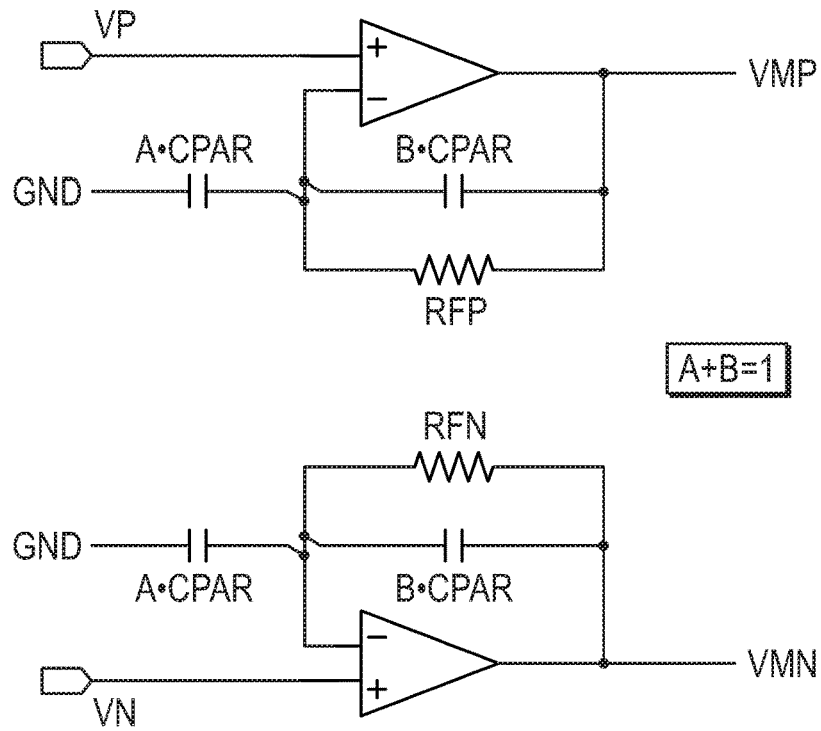
FIG. 10 shows a common mode half-circuit model, similar to that shown in FIG. 3, but in which at least a portion (B·$C_{PAR}$) of the parasitic capacitance $C_{PAR}$ can be placed in the feedback path of an operational amplifier, such as in a PGA or PGIA or other circuit.

FIG. 10 shows a common mode half-circuit model of the pre-amplifier of a programmable gain instrumentation amplifier, similar to that shown in FIG. 3, but in which at least a portion ($B \cdot C_{PAR}$) of the parasitic capacitance $C_{PAR}$ can be placed in the feedback path, such as by appropriately driving the switch 104, 204 using an output of the amplifier 108, 208. This can include leaving some portion ($A \cdot C_{PAR}$) of the parasitic capacitance $C_{PAR}$ (which portion, $A \cdot C_{PAR}$, can include or be substantially equivalent to an input capacitance of the amplifier 108, 208 appearing between the capacitance-sensitive inverting input of the amplifier 108, 208 and ground). The coefficients A, B can represent the respective portions of the parasitic capacitance $C_{PAR}$, such that A+B=1. In a PGIA pre-amplifier circuit implementation such as modeled in FIG. 10, the frequency response can be given according to the s-domain transfer function shown in Equation 7.

$$L(s) = A(s) \cdot \frac{sR_F \cdot BC_{PAR} + 1}{sR_F \cdot (A+B)C_{PAR} + 1} \qquad \text{Eq. 7}$$

From Equation 7, it can be see that splitting $C_{PAR}$ such that a portion ($B \cdot C_{PAR}$) of the parasitic capacitance $C_{PAR}$ can be placed in the feedback path can introduce a zero into the transfer function. If B>>A, then the pole and zero can almost cancel each other out, which can extend the frequency bandwidth of the PGIA pre-amplifier circuit, which can be accomplished without requiring extra components.

Figure 11:
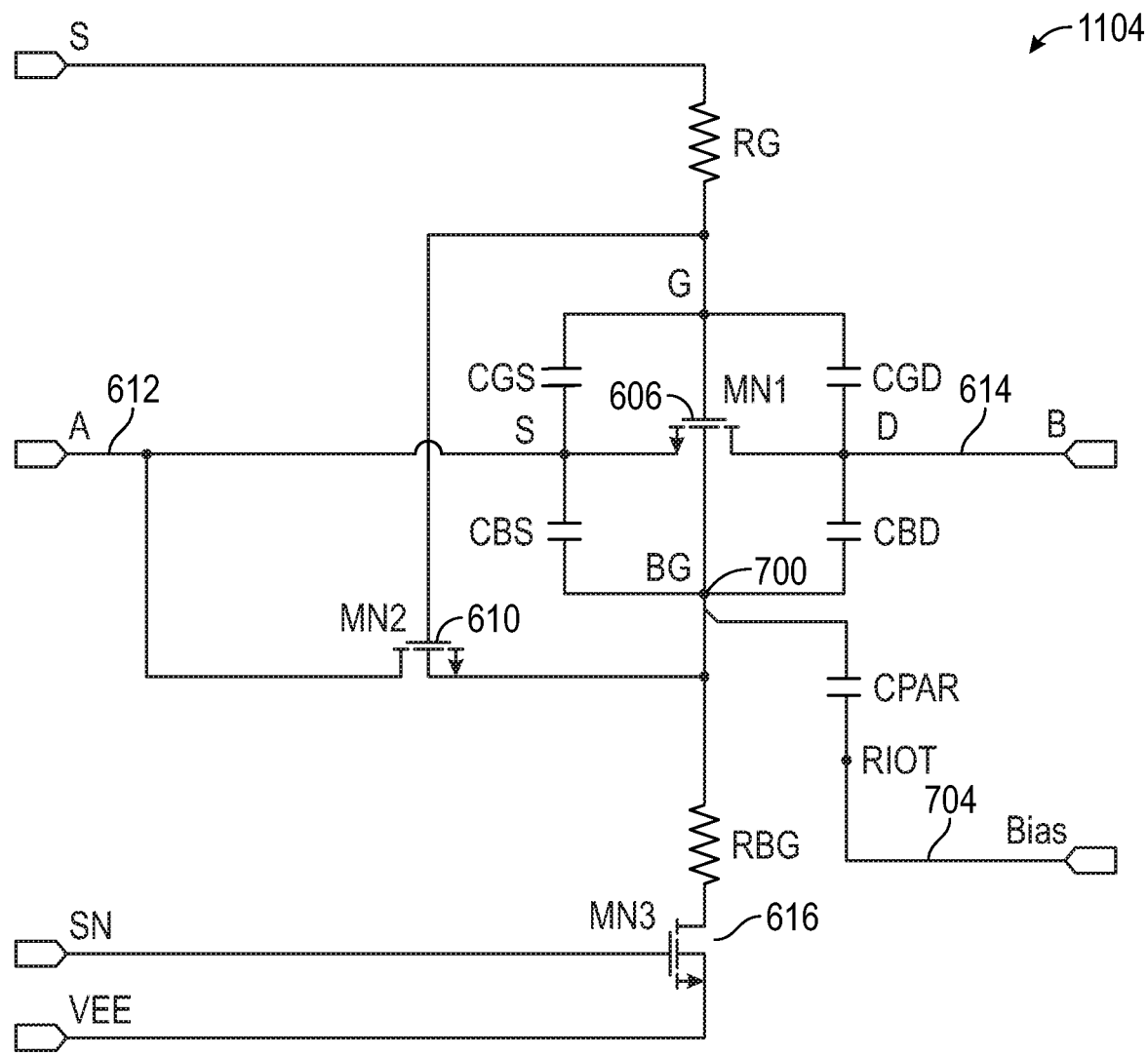
FIG. 11 shows an example of an analog switch circuit, which is similar in some respects to the analog switch circuit shown in FIG. 6, but which can omit the buffer circuit, such that a first semiconductor (RIOT) region can be electrically connected to a desired bias voltage such as to an output of an operational amplifier in a PGA or PGIA circuit.

FIG. 11 shows an example of an analog switch circuit 1104, which is similar in some respects to the analog switch circuit 604 shown in FIG. 6, but which can omit the buffer circuit 618. Like the analog switch circuit 604, the analog switch circuit 1104 can be used to provide one or more of the low capacitance switches 104 of FIGS. 1-2. In the analog switch circuit 1104, the RIOT region 704 (which is shown physically in the cross-sectional diagram of FIG. 7) can be driven or directly connected to a desired circuit node or signal voltage. In an example, the RIOT region 704 can be electrically connected to an output of the operational amplifier 108 of FIG. 1 or an output of one of operational amplifiers 208A-B of FIG. 2B, such as to provide a transfer function zero, for partial or complete pole cancellation as explained above with respect to Eq. 7 and FIG. 10. In another example, the RIOT region 704 can be electrically driven (e.g., by a buffer amplifier circuit) to a voltage like that at the output of the operational amplifier 108 of FIG. 1 or at the output of one of operational amplifiers 208A-B of FIG. 2B, such as to provide a transfer function zero, for partial or complete pole cancellation as explained above with respect to Eq. 7 and FIG. 10. In another example, such as shown in FIGS. 1 and 2B, the RIOT region 704 of the switch 104, 204 can be directly electrically connected to an output of the operational amplifier 108 of FIG. 1 or an output of one of operational amplifiers 208A-B of FIG. 2B, and the switch output at 614 can be directly or indirectly coupled (e.g., via one or more of the resistors 106, 207) to such output of the operational amplifier 108 of FIG. 1 or such output of one of operational amplifiers 208A-B of FIG. 2B. Thus, the RIOT region 704 can be electrically coupled to (or driven to a bias voltage like that of) an amplifier output in a preamplifier of a PGA circuit or if a PGIA circuit.

While FIG. 11 includes decoupling resistors RG and RBG and switching BG node 700 such as via switch 610, these are optional and are not required to obtain the enhanced frequency response using the pole-zero cancellation technique described herein.

Computer simulation of the CMOS transmission gate circuit 804 in a PGIA preamplifier with RIOT region 704 directly connected to a bias voltage an output of an operational amplifier of the PGIA was carried out and demonstrated both frequency bandwidth expansion and improved frequency response as compared to a CMOS transmission gate without driving the semiconductor RIOT region 704 to the a bias voltage an output of an operational amplifier of the PGIA.

Various Notes

The above description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Geometric terms, such as "parallel", "perpendicular", "round", or "square", are not intended to require absolute mathematical precision, unless the context indicates otherwise. Instead, such geometric terms allow for variations due to manufacturing or equivalent functions. For example, if an element is described as "round" or "generally round," a component that is not precisely circular (e.g., one that is slightly oblong or is a many-sided polygon) is still encompassed by this description.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The claimed invention is:

1. An analog switch circuit, comprising:
a first pass FET, including a gate coupled to a first control signal input, a first conduction terminal coupled to a signal input, a second conduction terminal coupled to a signal output, and a first body, wherein a local first semiconductor region is insulated by an underlying insulator and from the first body by a lateral insulator so as to be capable of being switchably driven independently from the first body.

2. The analog switch circuit of claim 1, wherein the local first semiconductor region is dedicated to the analog switch circuit by being additionally electrically isolated by a second insulator that, together with a first insulator and the underlying insulator, forms a moat region about or near the first pass FET, and wherein the local first semiconductor region is coupled to a circuit node, or driven to, a bias voltage.

3. The analog switch circuit of claim 2, wherein the local first semiconductor region is coupled to, or driven to a voltage like that of, one of the signal input or the signal output.

4. The analog switch circuit of claim 3, wherein the local first semiconductor region is coupled to, or driven to a voltage like that of, the signal output.

5. The analog switch circuit of claim 2, included in a feedback network of a programmable gain amplifier circuit, wherein the local first semiconductor region is electrically connected to a signal output of an amplifier of the programmable gain amplifier circuit.

6. The analog switch circuit of claim 2, included in a feedback network of a programmable gain instrumentation amplifier circuit, wherein the local first semiconductor region is electrically connected to a signal output of an amplifier of the programmable gain instrumentation amplifier circuit.

7. The analog switch circuit of claim 1, wherein the first body is switchably coupled to a first bias voltage via a first body decoupling resistor when the first pass FET is off, the first body also switchably coupled to at least one of the signal input or the signal output when the first pass FET is on.

8. The analog switch circuit of claim 7, wherein the first body is switchably coupled to the signal input when the first pass FET is on.

9. The analog switch circuit of claim 1, wherein the first pass FET includes the gate coupled to the first control signal input via a first gate decoupling resistor.

10. The analog switch circuit of claim 1, further comprising:
a second pass FET, including a gate coupled to a second control signal input, a first conduction terminal coupled to the signal input, a second conduction terminal coupled to the signal output, and a second body, wherein the second body is separated from a second local semiconductor region by an insulator, wherein the second local semiconductor region is coupled to a circuit node, or driven to a bias voltage; and
wherein the first pass FET is an NFET and the second pass FET is a PFET, and wherein the first pass FET and the second pass FET complement each other to form a transmission gate.

11. The analog switch circuit of claim 10, wherein the first semiconductor region and the second semiconductor region are shared in common between the first pass FET and the second pass FET.

12. The analog switch circuit of claim 10, wherein the second pass FET, includes the gate coupled to the second control signal input via a second gate decoupling resistor.

13. An analog switch circuit, comprising:
a first pass FET, including a gate coupled to a first control signal input via a first gate decoupling resistor, a first conduction terminal coupled to a signal input, a second conduction terminal coupled to a signal output, and a first body separated from a local first semiconductor region by a lateral first insulator; and
a second pass FET, including a gate coupled to a second control signal input via a second gate decoupling resistor, a first conduction terminal coupled to the signal input, a second conduction terminal coupled to the signal output, and a second body separated from a local second semiconductor region by a lateral second insulator; and
wherein the local first and second semiconductor regions are electrically connected to an amplifier signal output, and
wherein the local first and second semiconductor regions are insulated from the first body and by an underlying insulator so as to be capable of being switchably driven independently from the first and second bodies, respectively.

14. The analog switch circuit of claim 13, included in a feedback network of a programmable gain amplifier circuit, and wherein the local first and second semiconductor regions are connected to a signal output of an amplifier in the programmable gain amplifier circuit.

15. The analog switch circuit of claim 13, included in a feedback network of a programmable gain instrumentation amplifier circuit, and wherein the local first and second semiconductor regions are connected to a signal output of an amplifier in the programmable gain instrumentation amplifier circuit.

16. The analog switch circuit of claim 13, wherein the local first and second semiconductor regions are shared.

17. A method of using at least one first pass FET for switchably passing or isolating an analog signal from a signal input to a signal output, the method comprising:
providing a first control signal to a gate of the at least one first pass FET to turn the at least one first pass FET on to pass the analog signal from the signal input to the signal output and to turn the at least one first pass FET off to isolate the analog signal at the signal input from the signal output; and
switchably coupling or driving, to a circuit node or a bias voltage, a local first semiconductor region, separated from a body region of the at least one first pass FET by a first lateral insulator so as to be capable of being switchably coupled or driven independently from the body region, separated from other circuitry on an integrated circuit by a second insulator, and further insulated by an underlying third insulator.

18. The method of claim 17, comprising connecting the local first semiconductor region to the signal output of an amplifier circuit when the at least one first pass FET is on and when the at least one first pass FET is off.

19. The method of claim 17, comprising using the at least one first pass FET to selectively switch at least one element in a feedback network of at least one of programmable gain amplifier circuit or a programmable gain instrumentation amplifier circuit.

20. The method of claim 17, further comprising:
using a second pass FET complementary in type to the at least one first pass FET, for switchably passing or isolating an analog signal from a signal input to a signal output;
providing a second control signal to a gate of the second pass FET to turn the second pass FET on to pass the analog signal from the signal input to the signal output and to turn the second pass FET off to isolate the analog signal at the signal input from the signal output; and
coupling the local first semiconductor region, separated from a body region of the second pass FET by a second insulator, to the signal output of an operational amplifier circuit of a programmable gain amplifier (PGA) or a programmable gain instrumentation amplifier (PGIA) when the second pass FET is on and when the second pass FET is off.

* * * * *

UNITED STATES PATENT AND TRADEMARK OFFICE
CERTIFICATE OF CORRECTION

PATENT NO. : 10,560,061 B2
APPLICATION NO. : 15/254782
DATED : February 11, 2020
INVENTOR(S) : Herrera et al.

Page 1 of 1

It is certified that error appears in the above-identified patent and that said Letters Patent is hereby corrected as shown below:

On the Title Page

On page 2, in Column 2, under "Other Publications", Line 13, delete "Amendmebt" and insert --Amendment-- therefor In the Claims In Column 18, Line 9, in Claim 20, delete "FET" and insert --FET,-- therefor Signed and Sealed this
Eighteenth Day of August, 2020

Andrei Iancu
*Director of the United States Patent and Trademark Office*